(12) United States Patent
Chiu (10) Patent No.: US 11,175,318 B2
(45) Date of Patent: Nov. 16, 2021

(54) OVERCURRENT DETECTOR FOR A MULTI-CHANNEL LEVEL SHIFTER MODULE

(71) Applicant: NOVATEK MICROELECTRONICS CORP., Hsinchu County (TW)

(72) Inventor: Hsiang-Yi Chiu, New Taipei (TW)

(73) Assignee: NOVATEK MICROELECTRONICS CORP., Hsinchu Science Park (TW)

(*) Notice: Subject to any disclaimer, the term of this patent is extended or adjusted under 35 U.S.C. 154(b) by 32 days.

(21) Appl. No.: 16/799,498

(22) Filed: Feb. 24, 2020

(65) Prior Publication Data

US 2021/0063449 A1     Mar. 4, 2021

Related U.S. Application Data

(60) Provisional application No. 62/892,983, filed on Aug. 28, 2019.

(51) Int. Cl.
*G01R 19/165*     (2006.01)
*H02H 1/00*     (2006.01)

(52) U.S. Cl.
CPC ..... *G01R 19/16571* (2013.01); *H02H 1/0007* (2013.01)

(58) Field of Classification Search
CPC .................. G01R 19/16571; H02H 1/0007
USPC .................................................. 361/93.1, 87
See application file for complete search history.

(56) References Cited

U.S. PATENT DOCUMENTS 10,332,469 B2 *   6/2019   Li .................. G09G 3/3677

* cited by examiner

*Primary Examiner* — Dharti H Patel
(74) *Attorney, Agent, or Firm* — Hamre, Schumann, Mueller & Larson, P.C.

(57) ABSTRACT

An overcurrent detector for multiple level shifter circuits includes an overcurrent detecting circuit that senses currents acquired through level shifter circuits, and that outputs an indication signal indicating occurrence of overcurrent when one of the currents sensed thereby is greater than a predefined current level.

7 Claims, 5 Drawing Sheets

OVERCURRENT DETECTOR FOR A MULTI-CHANNEL LEVEL SHIFTER MODULE

CROSS-REFERENCE TO RELATED APPLICATION

This application claims priority of U.S. Provisional Patent Application No. 62/892,983, filed on Aug. 28, 2019, the contents of which are incorporated herein by reference.

FIELD

The disclosure relates to an overcurrent detector, and more particularly to an overcurrent detector for a multi-channel level shifter module.

BACKGROUND

In a thin film transistor (TFT) display panel, TFTs are driven by a gate voltage that is much higher than a voltage level commonly used in integrated circuit (IC) chips (e.g., 30 volts vs. 3.3 volts). Accordingly, a controller for a TFT display panel may need a level shifter module to translate a signal issued thereby to a higher voltage level, so as to drive operation of the TFTs. The level shifter module may be a multi-channel level shifter module that includes multiple level shifter circuits for TFTs in different sections of the display panel.

Figure 1:
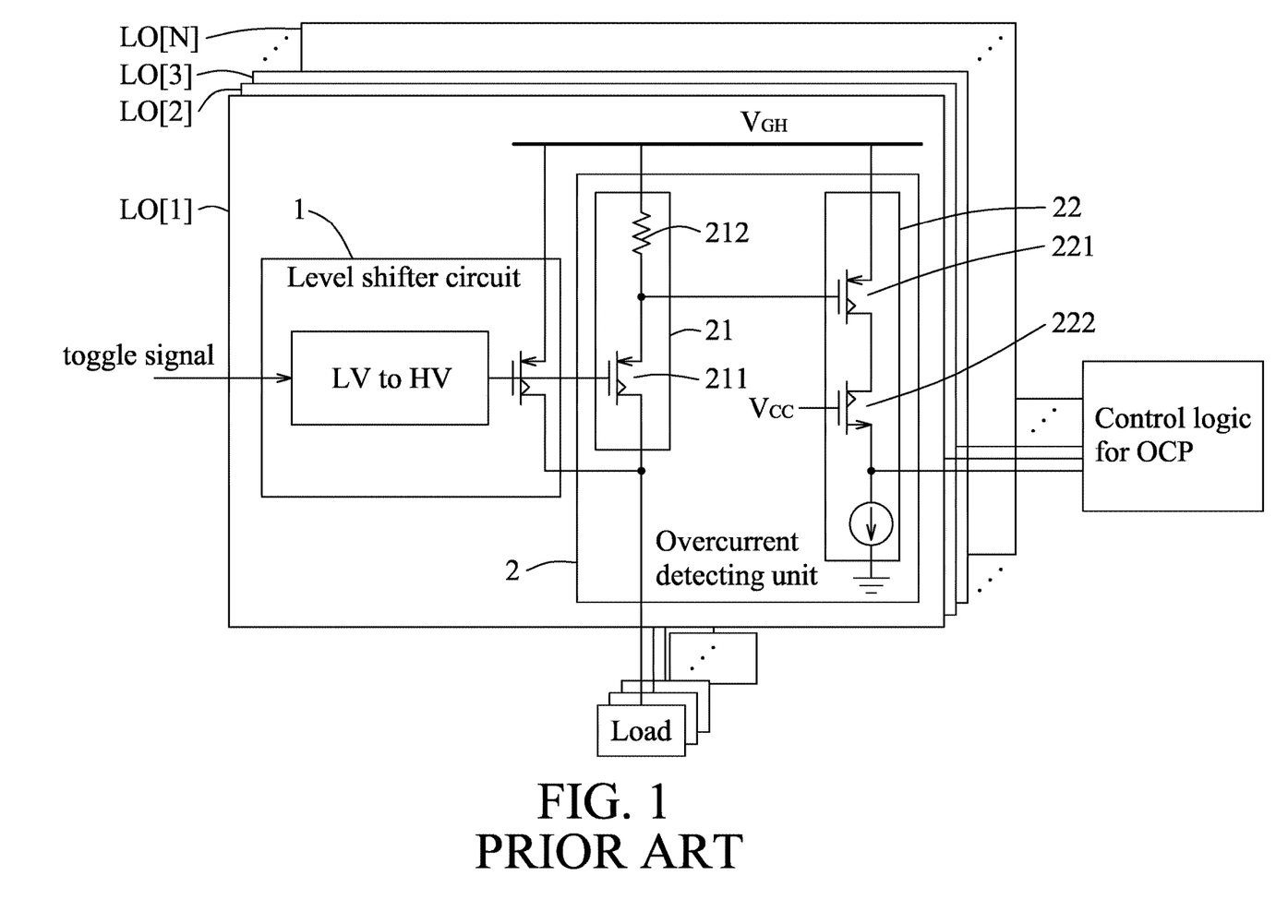
FIG. 1 is a block diagram illustrating a conventional design of an overcurrent detection circuit for a multi-channel level shifter module.

FIG. 1 illustrates a conventional design of an overcurrent detection circuit for a multi-channel level shifter module that includes multiple level shifter and overcurrent detection circuits LO[1]-LO[N], each of which includes a level shifter circuit 1 and an overcurrent detecting circuit 2. The overcurrent detecting circuit 2 includes a current sensing unit 21 that uses a transistor 211 and a resistor 212 to sense a current acquired through the level shifter circuit 1, and a voltage level transition unit 22 (a high-voltage (HV) to low-voltage (LV) circuitry) that uses two transistors 221, 222 to output, when overcurrent occurs in the corresponding level shifter circuit 1, an overcurrent indication signal at a voltage level that is required by a control logic relating to overcurrent protection (OCP, e.g., a forced shutdown of the display panel, or any other conventional mechanisms for overcurrent protection). However, mismatch among the same electronic components (e.g., transistors, or current sources, etc.) of the overcurrent detecting units 2 of the level shifter and overcurrent detection circuits LO[1]-LO[N] may lead to mismatch among overcurrent levels (used to determine occurrence of overcurrent) for the level shifter circuits 1 of the level shifter and overcurrent detection circuits LO[1]-LO[N]. Furthermore, in FIG. 1, each of the transistors 211, 221, 222 is a laterally diffused metal-oxide semiconductor (LDMOS) due to the need to work at high voltage bias, and thus a number 3N of LDMOSes are required for the overcurrent detecting units 2. With the LDMOS occupying a layout area greater than an ordinary metal-oxide-semiconductor field-effect transistor (MOSFET), the required number of LDMOSes would occupy a large layout area. In addition, LDMOSes tend to have greater mismatch than ordinary MOSFETs in terms of device characteristics, so overcurrent levels among the level shifter and overcurrent detection circuits LO[1]-LO[N] may not be the same.

SUMMARY

Therefore, an object of the disclosure is to provide an overcurrent detector for a multi-channel level shifter module. The overcurrent detector may alleviate at least one of the drawbacks of the prior art.

According to the disclosure, the overcurrent detector includes an overcurrent detecting circuit. The overcurrent detecting circuit includes a plurality of current sensing units and a plurality of overcurrent determination units. Each of the current sensing units is coupled to a respective one of the level shifter circuits to sense a current acquired through the respective one of the level shifter circuits, and is configured to output a sensed signal based on the current sensed thereby. Each of the overcurrent determination units is coupled to a respective one of the current sensing units for receiving the sensed signal therefrom, and has an output terminal to output a first indication signal when the sensed signal received by the overcurrent determination unit indicates that the current sensed by the respective one of the current sensing units is greater than a predefined current level. The output terminals of the overcurrent determination units are coupled to each other at a common node, and the overcurrent detecting circuit is configured to output a second indication signal that indicates occurrence of overcurrent in one of the level shifter circuits when any one of the output terminals of the overcurrent determination units outputs the first indication signal.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
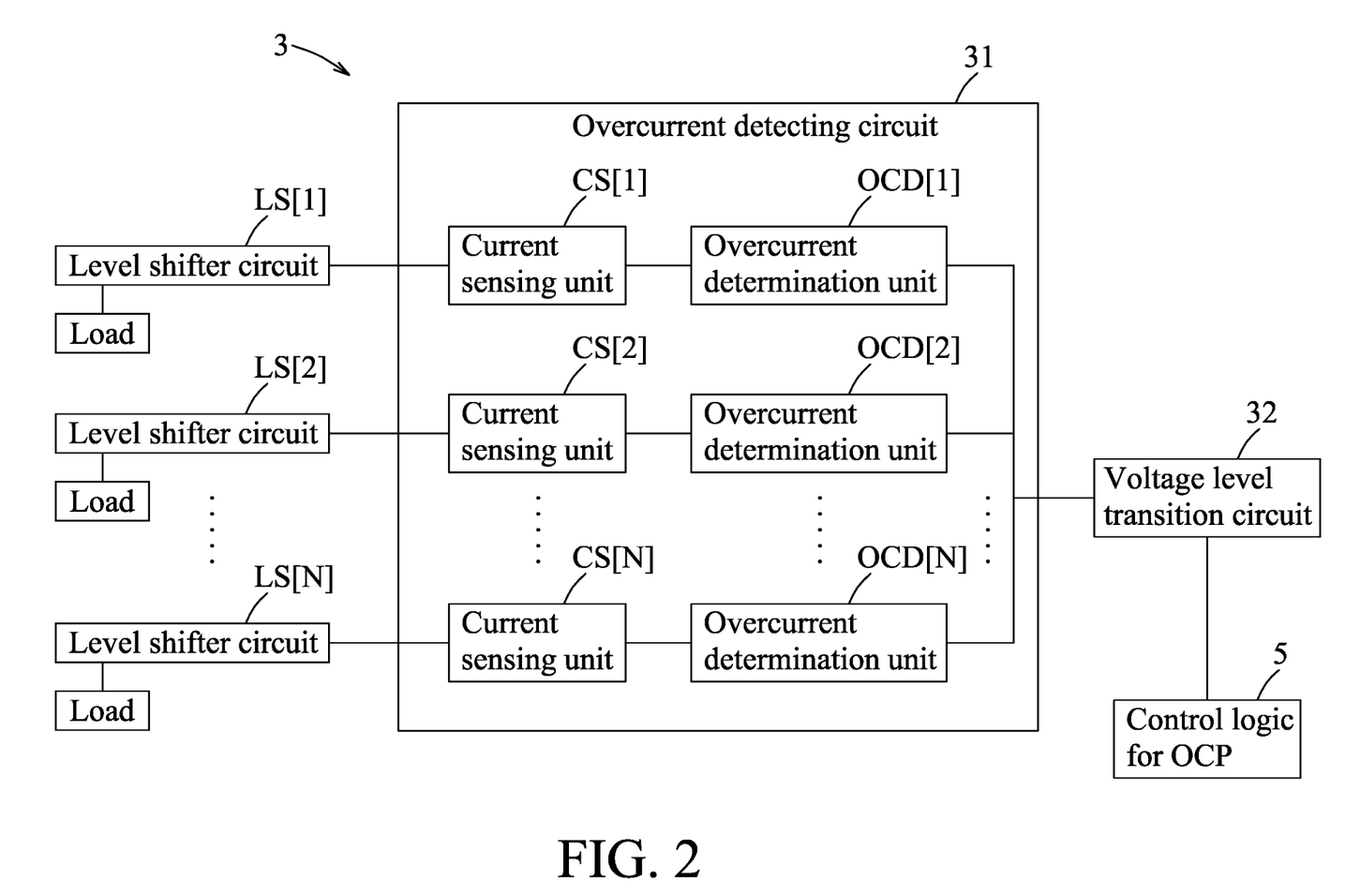
FIG. 2 is a block diagram illustrating a first embodiment of an overcurrent detector for a multi-channel level shifter module according to this disclosure.
Figure 3:
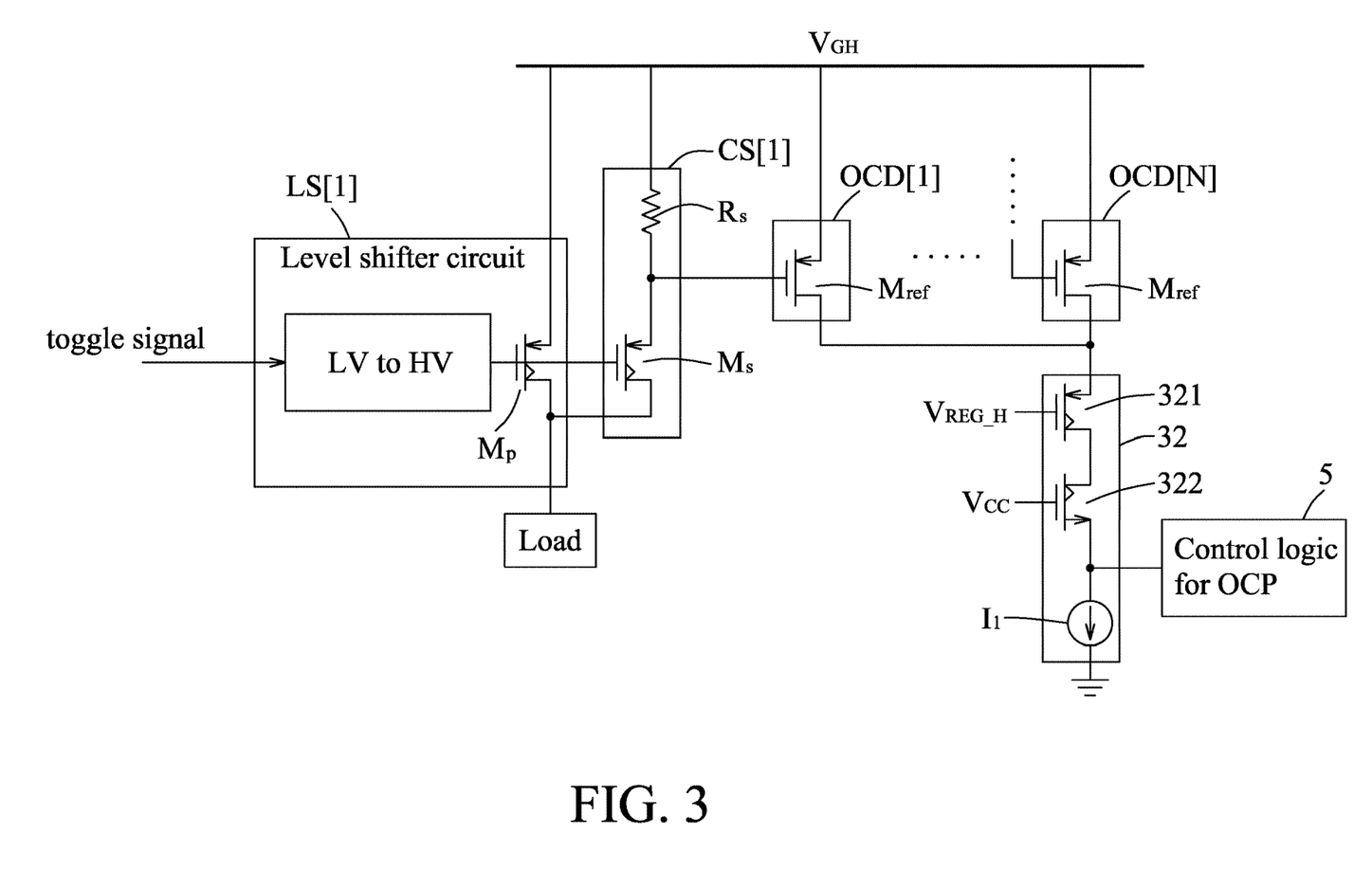
FIG. 3 is a schematic circuit diagram exemplarily illustrating a circuit design of the first embodiment.

FIGS. 2 and 3 illustrate a first embodiment of an overcurrent detector 3 for a multi-channel level shifter module according to this disclosure. The multi-channel level shifter module includes multiple level shifter circuits LS[1]-LS[N]. In this embodiment, the multi-channel level shifter module is used in a TFT display panel (not shown), but this disclosure is not limited in this respect. Each of the level shifter circuits LS[1]-LS[N] receives a toggle signal from a timing controller (not shown) of the display panel, and translates the toggle signal to a higher voltage level (e.g., from 3.3 volts to 30 volts) for use by TFT circuits (not shown). Each of the level shifter circuits LS[1]-LS[N] includes a driving transistor $M_p$ having a control terminal to receive the translated toggle signal, a first terminal coupled to a voltage source $V_{GH}$ (e.g., providing a voltage of 30 volts), and a second terminal coupled to a respective load (e.g., a TFT-based shift register on the display panel). When the translated toggle signal is provided to the driving transistor $M_p$, the driving transistor $M_p$ permits flow of a current from the voltage source $V_{GH}$ to the load therethrough, thereby driving the load. It is noted that the circuit exemplified in FIG. 3 is used to translate the toggle signal at logic high to a higher voltage level, and the multi-channel level shifter module according to this disclosure may further include another circuit, which has a similar structure as that shown in FIG. 3, to translate the toggle signal at logic low to a lower voltage level.

The overcurrent detector 3 includes an overcurrent detecting circuit 31 and a voltage level transition circuit 32. The overcurrent detecting circuit 31 includes a plurality of current sensing units CS[1]-CS[N], and a plurality of overcurrent determination units OCD[1]-OCD[N].

Each of the current sensing units CS[1]-CS[N] is coupled to a respective one of the level shifter circuits LS[1]-LS[N] to sense a current acquired through the respective one of the level shifter circuits LS[1]-LS[N], and generates a sensed signal based on the current sensed thereby. Each of the overcurrent determination units OCD[1]-OCD[N] is coupled to a respective one of the current sensing units CS[1]-CS[N] for receiving the sensed signal therefrom, and has an output terminal to output a first indication signal when the sensed signal received by the overcurrent determination unit indicates that the current sensed by the corresponding one of the current sensing units CS[1]-CS[N] is greater than a predefined current level. The output terminals of the overcurrent determination units OCD[1]-OCD[N] are coupled to each other at a common node, and the overcurrent detecting circuit 31 is configured to output a second indication signal that indicates occurrence of overcurrent in one (or more) of the level shifter circuits LS[1]-LS[N] when any one of the output terminals of the overcurrent determination units OCD[1]-OCD[N] outputs the first indication signal.

In this embodiment, each of current sensing units CS[1]-CS[N] includes a sensing transistor $M_s$ and a resistor $R_s$. The sensing transistor $M_s$ has a control terminal coupled to the control terminal of the driving transistor $M_p$ of the corresponding one of the level shifter circuits LS[1]-LS[N], a first terminal, and a second terminal electrically connected to the second terminal of the driving transistor $M_p$ of the corresponding one of the level shifter circuits LS[1]-LS[N]. The resistor $R_s$ couples the first terminal of the sensing transistor $M_s$ to the first terminal of the driving transistor $M_p$ of the corresponding one of the level shifter circuits LS[1]-LS[N] (i.e., coupled to the voltage source $V_{GH}$). For each of the current sensing units CS[1]-CS[N], a current flowing through the sensing transistor $M_s$ would reflect a current flowing through the driving transistor $M_p$ of the corresponding one of the level shifter circuits LS[1]-LS[N], achieving a purpose of sensing the current acquired through the corresponding one of the level shifter circuits LS[1]-LS[N].

In this embodiment, each of the overcurrent determination units OCD[1]-OCD[N] includes a reference transistor $M_{ref}$ that has a control terminal coupled to the first terminal of the sensing transistor $M_s$ of the corresponding one of the current sensing units CS[1]-CS[N], a first terminal coupled to the voltage source $V_{GH}$, and a second terminal that serves as the output terminal of the overcurrent determination unit OCD[1]-OCD[N]. In this embodiment, the first indication signal that is transmitted through the common node of the output terminals of the overcurrent determination units OCD[1]-OCD[N] serves as the second indication signal. It is noted that the reference transistor $M_{ref}$ is implemented using an ordinary MOSFET for minimizing the relevant layout area.

The voltage level transition circuit 32 is coupled to the overcurrent detecting circuit 31 for receiving the second indication signal therefrom, and is configured to reduce a voltage level of the second indication signal so as to output a third indication signal to a control logic circuit 5, which is implemented using ordinary MOSFETS and which operates at a voltage level (e.g., 3.3 volts) lower than that raised to by the multi-channel level shifter module and used by the TFT circuits (e.g., 30 volts), and which is used to activate overcurrent protection.

In this embodiment, the voltage level transition circuit 32 includes a first transistor 321, a second transistor 322, and a current source $I_1$. The first transistor 321 has a control terminal disposed to receive a first voltage $V_{REG\_H}$ (e.g., 25 volts), a first terminal coupled to the common node of the output terminals of the overcurrent determination units OCD[1]-OCD[N] for receiving the second indication signal therefrom, and a second terminal. The second transistor 322 has a control terminal disposed to receive a second voltage $V_{CC}$ (e.g., 3.3 volts, a logic high voltage for the control logic circuit 5) that is smaller than the first voltage $V_{REG\_H}$, a first terminal coupled to the second terminal of the first transistor 321, and a second terminal disposed to output the third indication signal. The current source $I_1$ is coupled between the second terminal of the second transistor 322 and ground, and permits a current with a predetermined magnitude to flow therethrough.

In one exemplary implementation of the first embodiment, the toggle signal may be provided to only one of the level shifter circuits LS[1]-LS[N] at a time, so there would only be one current sensing unit CS[1]-CS[N] performing current sensing at a time. For each of the current sensing units CS[1]-CS[N] and the corresponding one of the overcurrent determination units OCD[1]-OCD[N], when the current acquired through the corresponding one of the level shifter circuits LS[1]-LS[N] is greater than the predefined current level, which is cooperatively determined by parameters related to the resistor $R_s$, the transistor $M_s$ and the transistor $M_{ref}$ (such as resistance of the resistor $R_s$, W/L ratio of the transistor $M_s$, threshold voltage of the transistor $M_{ref}$, etc.), the current flowing through the resistor $R_s$ and the sensing transistor $M_s$ would be so large that a voltage at the control terminal of the reference transistor $M_{ref}$ makes a current (i.e., the first/second indication signal) flowing through the transistors $M_{ref}$, 321, 322 greater than the current flowing through the current source $I_1$, and the third indication signal is generated at the second terminal of the second transistor 322 of the voltage level transition circuit 32 (e.g., at a logic high voltage for the control logic circuit 5), thereby triggering the control logic circuit 5 to activate overcurrent protection.

It is noted that each of the transistors 321, 322 in this embodiment is an LDMOS for withstanding a high voltage stress. The transistor 322 is used to make transition from a high voltage level to a low voltage level. The transistor 321 cooperates with the transistor 322 to withstand great voltage between the second terminal of the transistor 322 and the common node of the output terminals of the overcurrent determination units OCD[1]-OCD[N], so as to protect the reference transistors $M_{ref}$ of the overcurrent determination units OCD[1]-OCD[N] and the control logic circuit 5 from high voltage.

As a result, the overcurrent detector 3 uses a number (N+2) of LDMOSes (including a number N of sensing transistors Ms, and the transistors 321, 322) in total, which is fewer than the conventional design of the overcurrent detection circuit that uses a number 3N of LDMOSes, as shown in FIG. 1. If N=10, the number of LDMOSes used in this embodiment is significantly reduced to 40% that of the conventional design of the overcurrent detection circuit. Furthermore, since the reference transistors $M_{ref}$ are implemented using ordinary MOSFETs that have better mismatch than LDMOSes in terms of device characteristics, and share the same current source $I_1$, mismatch of overcurrent levels among the level shifter circuits LS[1]-LS[N] can thus be reduced.

Figure 4:
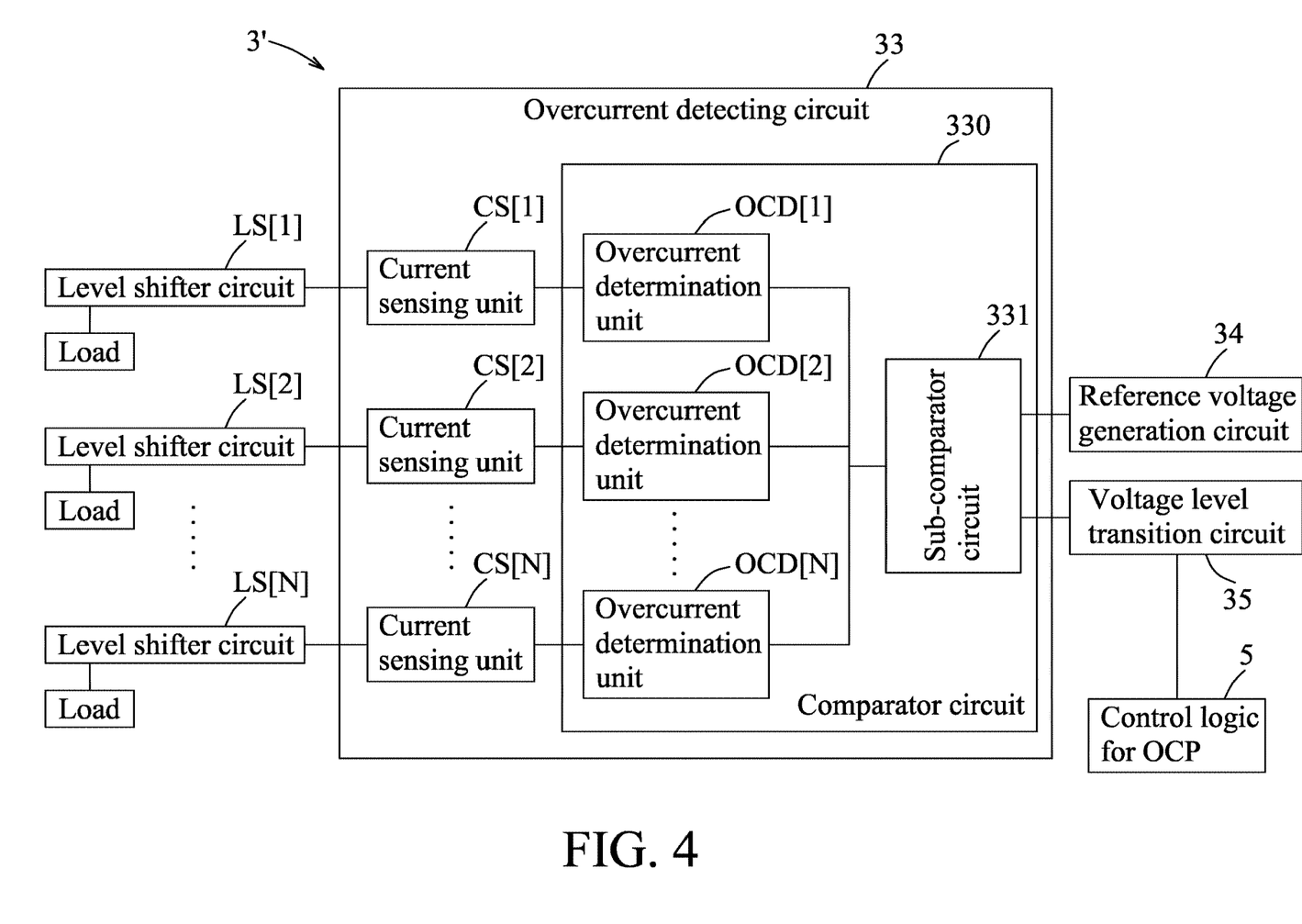
FIG. 4 is a block diagram illustrating a second embodiment of an overcurrent detector for a multi-channel level shifter module according to this disclosure.
Figure 5:
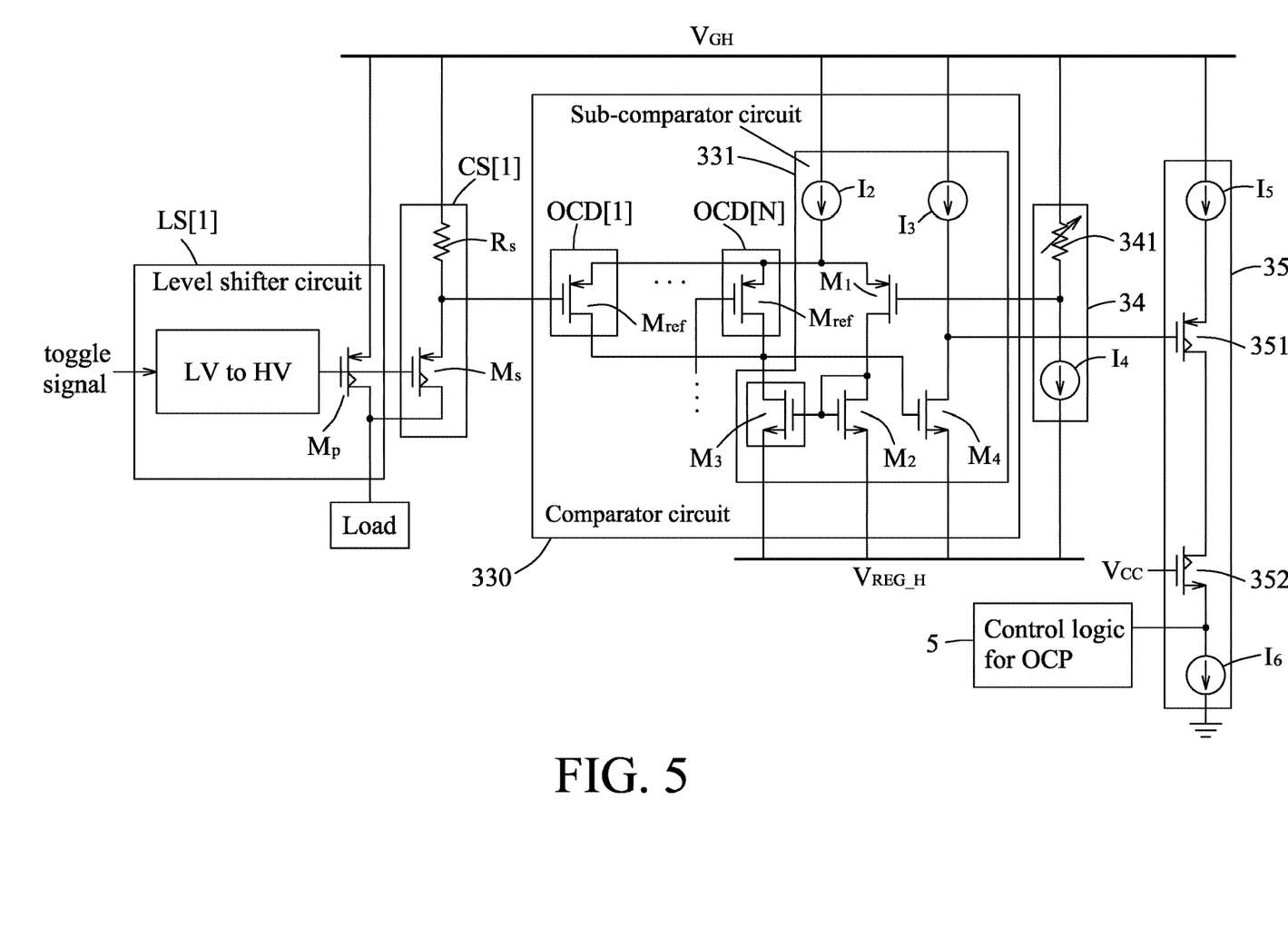
FIG. 5 is a schematic circuit diagram exemplarily illustrating a circuit design of the second embodiment.

FIGS. 4 and 5 illustrate a second embodiment of an overcurrent detector 3' for the multi-channel level shifter module according to this disclosure. It is noted that the circuit exemplified in FIG. 5 is used to translate the toggle signal at logic high to a higher voltage level, and the multi-channel level shifter module according to this disclosure may further include another circuit, which has a similar structure as that shown in FIG. 5, to translate the toggle signal at logic low to a lower voltage level. The overcurrent detector 3' includes an overcurrent detecting circuit 33, a reference voltage generation circuit 34 and a voltage level transition circuit 35. The overcurrent detecting circuit 33 includes the current sensing units CS[1]-CS[N] as described in the first embodiment, and a comparator circuit 330 that is cooperatively formed by the overcurrent determination units OCD[1]-OCD[N] as described in the first embodiment, and a sub-comparator circuit 331. The comparator circuit 330 has a plurality of first input terminals respectively being the control terminals of the reference transistors $M_{ref}$ of the overcurrent determination units OCD[1]-OCD[N], a second input terminal disposed to receive a reference voltage $V_{ref}$, and an output terminal at which the second indication signal is outputted. The comparator circuit 330 generates the second indication signal based on a comparison between a voltage at each of the first input terminals of the comparator circuit 330 and the reference voltage at the second input terminal of the comparator circuit 330. In this embodiment, the current sensing units CS[1]-CS[N] and the overcurrent determination units OCD[1]-OCD[N] are connected as described in the first embodiment, so details thereof are not repeated herein for the sake of brevity. The sub-comparator circuit 331 has an input terminal coupled to the common node of the output terminals of the overcurrent determination units OCD[1]-OCD[N] and has the second input terminal and the output terminal of the comparator circuit 330. In detail, the sub-comparator circuit 331 of this embodiment includes two current sources $I_2$ and $I_3$, and four transistors $M_1$-$M_4$. The transistor $M_1$ has a control terminal serving as the second input terminal of the comparator circuit 330 to receive the reference voltage $V_{ref}$, a first terminal, and a second terminal. The current source $I_2$ is coupled between a voltage source $V_{GH}$ (e.g., providing a voltage of 30V) and the first terminal of the transistor $M_1$. The second transistor $M_2$ has a first terminal coupled to the second terminal of the transistor $M_1$, a second terminal coupled to a voltage source $V_{REG\_H}$ (e.g., providing a voltage of 25 volts), and a control terminal coupled to the first terminal thereof. The transistor $M_3$ has a control terminal coupled to the control terminal of the transistor $M_2$, a first terminal coupled to the common node of the output terminals of the overcurrent determination units OCD[1]-OCD[N], and a second terminal coupled to the voltage source $V_{REG\_H}$. The transistor $M_4$ has a control terminal coupled to the first terminal of the transistor $M_3$, a first terminal serving as the output terminal of the comparator circuit 330, and a second terminal coupled to the voltage source $V_{REG\_H}$. The current source $I_3$ is coupled between the voltage source VGH and the first terminal of the transistor $M_4$. The reference transistor $M_{ref}$ of an arbitrary one of the overcurrent determination units OCD[1]-OCD[N] cooperates with the sub-comparator circuit 331 to form a comparator that compares a voltage at the control terminal of the reference transistor $M_{ref}$ and the voltage at the second input terminal of the comparator circuit 330. In this embodiment, each of the transistors $M_{ref}$, $M_1$-$M_4$ is an ordinary MOSFET for minimizing the relevant layout area.

The reference voltage generation circuit 34 includes a variable resistor 341 and a current source $I_4$. The variable resistor 341 has a first terminal coupled to the voltage source $V_{GH}$, and a second terminal coupled to the second input terminal of the comparator circuit 33. The current source $I_4$ is coupled between the voltage source $V_{REG\_H}$ and the second terminal of the variable resistor 341. A magnitude of the reference voltage $V_{ref}$ is determined based on a resistance of the variable resistor 341 and a current flowing through the variable resistor 341 and the current source $I_4$, so the overcurrent level of the overcurrent detector 3' is adjustable by means of changing the parameters of the variable resistor 341 and/or the current source $I_4$.

Similar to the first embodiment, the voltage level transition circuit 35 reduces a voltage level of the second indication signal, so as to output a third indication signal for use by the control logic circuit 5 for OCP. The voltage level transition circuit 35 includes a first current source $I_5$, a second current source $I_6$, a first transistor 351 and a second transistor 352. The first transistor 351 has a control terminal coupled to the output terminal of the comparator circuit 33 for receiving the second indication signal therefrom, a first terminal, and a second terminal. The first current source $I_5$ is coupled between the voltage source $V_{GH}$ and the first terminal of the first transistor 351. The second transistor 352 has a control terminal to receive a predetermined voltage $V_{CC}$ (e.g., 3.3 volts, a logic high voltage for the control logic circuit 5), a first terminal coupled to the second terminal of the first transistor 351, and a second terminal to output the third indication signal. The second current source $I_6$ is coupled between the second terminal of the second transistor 352 and ground.

In one exemplary implementation of the second embodiment, the toggle signal may be provided to only one of the level shifter circuits LS[1]-LS[N] at a time, so only one of the current sensing units CS[1]-CS[N] would be performing current sensing at a time. For each of the current sensing units CS[1]-CS[N] and the corresponding one of the overcurrent determination units OCD[1]-OCD[N], when the current acquired through the corresponding one of the level shifter circuits LS[1]-LS[N] is greater than the predefined current level so the voltage at the control terminal of the corresponding reference transistor $M_{ref}$ is lower than the reference voltage $V_{ref}$, the comparator circuit 33 outputs a logic low (the second indication signal) at the output terminal thereof, making a current that is greater than the current acquired through the second current source $I_6$ flow through the transistors 351, 352 of the voltage level transition circuit 35, so the third indication signal (e.g., at a logic high voltage for the control logic circuit 5) is generated at the second terminal of the transistor 352, triggering the control logic circuit 5 to activate overcurrent protection. It is noted that each of the transistors 351, 352 is an LDMOS for withstanding a high voltage stress in this embodiment. The second transistor 352 is used to make transition from a high voltage level to a low voltage level. The first transistor 351 cooperates with the second transistor 352 to withstand great voltage between the second terminal of the second transistor 352 and the first terminal of the first transistor 351, so as to protect the control logic circuit 5 from a high voltage. As a result, the overcurrent detector 3' uses a number (N+2) of LDMOSes (including a number N of sensing transistors $M_s$, and the transistors 351, 352) in total, which is less than the conventional design of the overcurrent detection circuit that uses a number 3N of LDMOSes, as shown in FIG. 1. In this embodiment, since the reference transistors $M_{ref}$ are also implemented using ordinary MOSFETs that have less mismatch than LDMOSes in terms of device characteristics, and the transistor $M_1$ of the sub-comparator circuit 331 is shared among multiple pairs of the current sensing unit and the overcurrent determination unit, mismatch of overcurrent levels among the level shifter circuits LS[1]-LS[N] can thus be reduced.

In summary, the embodiments of the overcurrent detector 3, 3' for a multi-channel level shifter module according to this disclosure includes a plurality of current sensing units and a plurality of overcurrent determination units that come in pairs (one current sensing unit paired with one overcurrent determination unit) and that share the same voltage level transition circuit, so as to reduce layout area and enhance consistency of overcurrent levels for the level shifter circuits of the multi-channel level shifter module.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An overcurrent detector for a multi-channel level shifter module that includes multiple level shifter circuits, the overcurrent detector comprising:
   an overcurrent detecting circuit including:
      a plurality of current sensing units, each of which is coupled to a respective one of the level shifter circuits to sense a current acquired through the respective one of the level shifter circuits, and is configured to output a sensed signal based on the current sensed thereby;
      a plurality of overcurrent determination units, each of which is coupled to a respective one of said current sensing units for receiving the sensed signal therefrom, and has an output terminal to output a first indication signal when the sensed signal received by the overcurrent determination unit indicates that the current sensed by the respective one of the current sensing units is greater than a predefined current level, wherein said output terminals of said overcurrent determination units are coupled to each other at a common node, and said overcurrent detecting circuit is configured to output a second indication signal that indicates occurrence of overcurrent in one of the level shifter circuits when any one of said output terminals of said overcurrent determination units outputs the first indication signal; and
   a voltage level transition circuit coupled to said overcurrent detecting circuit for receiving the second indication signal therefrom, and configured to reduce a voltage level of the second indication signal, so as to output a third indication signal for a circuit which operates at a voltage level lower than that raised to by the multi-channel level shifter module and which is used to activate overcurrent protection.

2. The overcurrent detector of claim 1, wherein each of said current sensing units includes:
   a sensing transistor having a control terminal to be coupled to the respective one of the level shifter circuits for receiving a toggle signal that activates said current sensing unit to sense the current acquired through the respective one of the level shifter circuits, a first terminal, and a second terminal to be coupled to the respective one of the level shifter circuits; and
   a resistor to couple said first terminal of said sensing transistor to the respective one of the level shifter circuits;
   wherein each of said overcurrent determination units includes:
      a reference transistor having a control terminal coupled to said first terminal of said sensing transistor of the respective one of said current sensing units, a first terminal to be coupled to a voltage source, and a second terminal that serves as said output terminal of said overcurrent determination unit.

3. The overcurrent detector of claim 2, wherein the first indication signal transmitted through said common node of said output terminals of said overcurrent determination units serves as the second indication signal, and said voltage level transition circuit includes:
   a first transistor having a control terminal disposed to receive a first voltage, a first terminal coupled to said common node of said output terminals of said overcurrent determination units for receiving the second indication signal therefrom, and a second terminal; and
   a second transistor having a control terminal disposed to receive a second voltage that is smaller than the first voltage, a first terminal coupled to said second terminal of said first transistor, and a second terminal to be coupled to a current source and disposed to output the third indication signal.

4. The overcurrent detector of claim 2, wherein said overcurrent detecting circuit includes a comparator circuit having a plurality of first input terminals which are respectively said control terminals of said reference transistors of said overcurrent determination units, a second input terminal which is disposed to receive a reference voltage, and an output terminal at which the second indication signal is outputted, said comparator circuit being configured to generate the second indication signal based on a comparison between a voltage at each of said first input terminals thereof and the reference voltage at said second input terminal thereof.

5. The overcurrent detector of claim 4, wherein said comparator circuit includes said overcurrent determination units, and a sub-comparator circuit that has an input terminal coupled to said common node of said output terminals of said overcurrent determination units and that has said second input terminal and said output terminal of said comparator circuit, wherein said reference transistor of an arbitrary one of said overcurrent determination units cooperates with said sub-comparator circuit to form a comparator that compares a voltage at said control terminal of said reference transistor and the voltage at said second input terminal of said comparator circuit.

6. The overcurrent detector of claim 5, further comprising:
   a variable resistor that has a first terminal to be coupled to the voltage source, and a second terminal coupled to said second input terminal of said comparator circuit and to be coupled to a current source.

7. The overcurrent detector of claim 4, wherein said voltage level transition circuit includes:
   a first transistor having a control terminal coupled to said output terminal of said comparator circuit for receiving the second indication signal therefrom, a first terminal to be coupled to a first current source, and a second terminal; and
   a second transistor having a control terminal disposed to receive a predetermined voltage, a first terminal coupled to said second terminal of said first transistor, and a second terminal to be coupled to a second current source and to output the third indication signal.

* * * * *